United States Patent [19]

Yamagishi et al.

[11] Patent Number: 4,965,225
[45] Date of Patent: Oct. 23, 1990

[54] METHOD OF STABILIZING AMORPHOUS SEMICONDUCTORS

[75] Inventors: Hideo Yamagishi; William A. Nevin; Hitoshi Nishio; Keiko Miki; Kazunori Tsuge; Yoshihisa Tawada, all of Hyogo, Japan

[73] Assignee: Kanegafuchi Chemical Industry Co., Ltd., Osaka, Japan

[21] Appl. No.: 413,916

[22] Filed: Sep. 28, 1989

[30] Foreign Application Priority Data

Sep. 30, 1988 [JP] Japan ................... 63-248451

[51] Int. Cl.⁵ ............... H01L 21/477; H01L 21/42
[52] U.S. Cl. ................................ 437/173; 437/174; 437/247; 437/101; 437/943
[58] Field of Search ............... 437/101, 173, 174, 247

[56] References Cited

U.S. PATENT DOCUMENTS

| | | | |
|---|---|---|---|
| 4,181,538 | 1/1980 | Narayan et al. | 437/247 |
| 4,409,134 | 10/1983 | Yamazaki | 252/518 |
| 4,826,711 | 5/1989 | Yamazaki et al. | 437/248.1 |
| 4,888,305 | 12/1989 | Yamazaki et al. | 437/101 |

OTHER PUBLICATIONS

M. O. Thompson et al., Phys. Rev. Lett., vol. 52, #26, p. 2360.
H. Voll Traver et al., "Light-Induced Changes in a--SI:H at High Illumination", in Proc. 18th IEEE Photovoltaic Specialists Conference, p. 1760.
Navkhandewqla, R. V. et al., Phys. Rev. B, vol. 24, No. 12, p. 7443.
A New Stable a-SIC/a-SiH Heterojunction Solar Cells, Included in Proceedings of the 18th IEEE Photovoltaic Specialist Conference, Las Vegas, Nev., Oct. 21-25, 1985.

Primary Examiner—Brian E. Hearn
Assistant Examiner—Gordon V. Hugo
Attorney, Agent, or Firm—Jordan and Hamburg

[57] ABSTRACT

An amorphous semiconductor film is prepared by the usual procedure and, then, established by exposing it to sufficient light intermittently to age the same. The degradation of the electrical characteristics of the semiconductor film on prolonged exposure to light is minimized by the above technique. The preferred intermittent light is a pulsed light. The above light treatment may be applied to an individual semiconductor film, a laminated assembly including at least the pin layers, a finished semiconductor device such as a solar cell or a semiconductor device prior to attachment of an electrode.

7 Claims, 3 Drawing Sheets

METHOD OF STABILIZING AMORPHOUS SEMICONDUCTORS

BACKGROUND OF THE INVENTION

1. Technical Field

The present invention relates to a method of stabilizing amorphous semiconductors, thus-stabilized amorphous semiconductors and devices using such semiconductors. More particularly, the invention relates to a method of stabilizing an amorphous semiconductor against the deleterious effect of prolonged exposure to light on its electrical characteristics, a semiconductor stabilized by said method, and amorphous semiconductor devices using the thus-stabilized semiconductor.

2. Background Art

Tetrahedral amorphous semiconductors, such as amorphous silicon, which are obtainable by the plasma CVD technique or the like are highly amenable to large-area architecture and cost reduction so that recently much interest has been focused on their application to solar cells, thin-film transistors, large-area sensors and so on. However, when such semiconductors are applied to photoelectric energy conversion, the stability of the semiconductors to light is a matter demanding sophisticated attention. The photodegradation of amorphous silicon was discovered by Drs. Staebler and Wronsky as early as in 1977 and particularly the aging of its electrical characteristics due to light, especially intense light, has been a major bottleneck in the application of this material to solar cells, electrophotographic process photoreceptor drums and other devices.

DISCLOSURE OF INVENTION

The object of the present invention, conceived and developed to resolve the above-mentioned problems, is to provide a method of minimizing the photodegradation of the electrical characteristics of a tetrahedral amorphous semiconductor and improving its light resistance particularly in such fields of application as solar cells etc., a stabilized tetrahedral amorphous semiconductor produced by said method, and an amorphous semiconductor device using such an amorphous semiconductor.

The stabilized amorphous silicon semiconductor according to the present invention is produced by the method which comprises decomposing silane gas or a silane-containing gas with any of plasma, heat and light or two or more of them in combination or carrying out a sputtering or reactive sputtering process using either silicon or a silcon compound as the target to form a silicon amorphous semiconductor film on a substrate and, then, subjecting said silicon amorphous semiconductor film to intermittent irradiation with light of high intensity at above room temperature.

The a-Si semiconductor according to the present invention is stable against light and can be used advantageously in semiconductor devices inclusive of solar cells, photosensors and so on.

DETAILED DESCRIPTION OF THE PREFERRED EMBODIMENT

Figure 1:
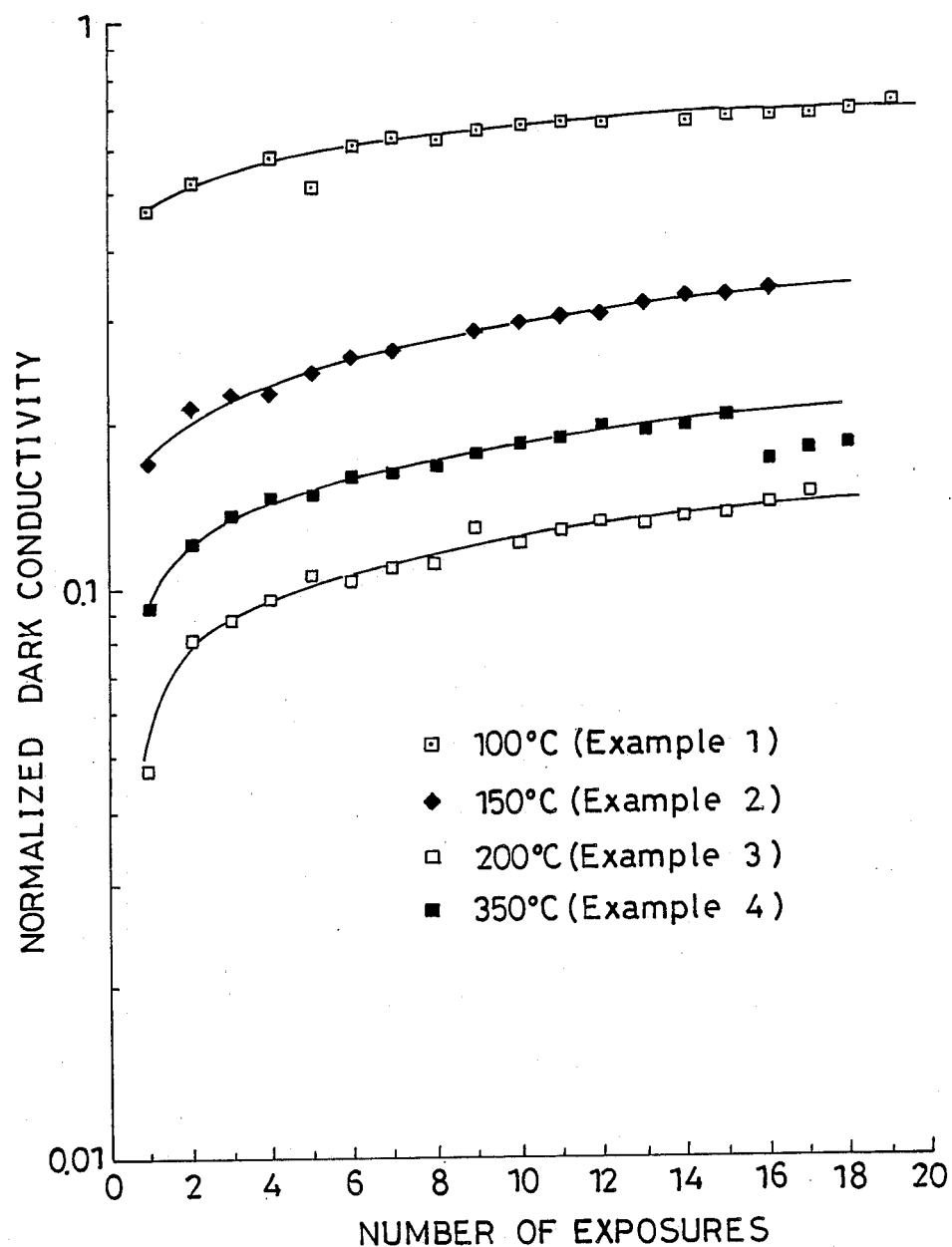
FIG. 1 is a pulse irradiation time-dark conductivity diagram showing the change in normalized dark conductivity in the course of stabilization of an amorphous semiconductor according to the present invention.

The semiconductor according to the present invention is characterized in that after an amorphous semiconductor film is prepared by the per se conventional technique, the film is stabilized by intermittent exposure to light which is sufficient to age it. Generally, a silicon amorphous semiconductor film is prepared by decomposing silane gas or a silane-containing gas using any of plasma, heat and light or two or more of them in combination or carrying out a sputtering process using silicon or a silicon compound as the target or a reactive sputtering process employing the elements to constitute the semiconductor and the necessary impurity to thereby deposit the semiconductor on a substrate. In the present invention, such a deposited film or a device including the deposited film is exposed to pulsed light at above room temperature to thereby increase the stability of the semiconductor film or device against light.

Though it is not definitely clear why the photodegradation of a semiconductor can be minimized in accordance with the present invention, the following hypothesis may be advanced for the mechanism involved. A breakdown of the Si—Si weak bonds in the film has been considered to be a major factor in the photodegradation of a semiconductor. Any two dangling bonds formed as the result of such a breakdown move around freely along with the diffusion of hydrogen in the film. At a somewhat elevated temperature, the probability of mutual approach of the dangling bonds is increased, with the result that the dangling bonds disappear and new Si—Si bonds are formed. Thus, when the film is annealed at a high temperature, the defects (dangling bonds) in the semiconductor are decreased to result in thermal recovery. It is generally considered that the initial characteristics are regained after 30 minutes of treatment at 150° C. If it is postulated that the newly formed Si—Si bonds are not necessarily the same as the Si—Si weak bonds destroyed by light and that there are created some Si—Si bonds which are hard to be disrupted by light, it will be possible to explain that the light resistance of the semiconductor is gradually increased as the irradiation and thermal recovery cycle is repeated. This effect has been experimentally established by the inventors of the present invention.

However, it takes much time and, hence, it is virtually impractical to improve the light resistance of the semiconductor film by the above-mentioned procedure. More specifically in order to improve the light resistance by taking advantage of the above phenomenon, it is more practically sensible to irradiate the film at a high temperature than repeating the cycle of photo-aging, temperature increase, thermal annealing and temperature decrease. In other words, the desired improvement of light resistance may be easily accomplished if a state rich in dangling bonds is created at a high temperature.

Actually, however, at a temperature not less than 150° C., the photo-aging does not proceed to an appreciable extent when the irradiation intensity of exposure light is of the order of solar radiation. This is probably because the velocity of thermal recovery is too high. The present invention has been accomplished on the basis of the above discovery and, as such, is characterized in that the Si—Si bonds are artificially cleaved at a high temperature using a pulsed light of high intensity. It is generally considered that the number of dangling bonds after aging is proportional to $I^{\frac{1}{3}}t^{\frac{1}{3}}$, where I stands for the intensity of exposure light and t for irradiation time. Thus, the time required for inducing a given degree of aging can be reduced to 1/10,000 by increasing the quantity of light by 100-fold. Therefore, with a light output of 1 KW/cm² which is equal to $10^4$ times the intensity of solar radiation, it is theoretically sufficient to set the exposure time at only $4\times10^{-3}$ seconds for performing an aging operation which would require 100 hours of irradiation when solar light is employed, thus permitting sufficient aging to take place at a temperature not less than 150° C. to thereby insure the desired improvement of light resistance. In this connection, it is difficult to actually provide a source of continuous light with an output intensity of 1 KW/cm² and it is an essential feature of the present invention to employ a pulsed light source.

The output of the exposure pulsed light should be not less than 10 W/cm² and preferably not less than 100 W/cm². The irradiation time per pulse is generally not more than 1/10 seconds. This pulsed light is either visible light or ultraviolet light and should have a wavelength not longer than 700 nm.

The amorphous semiconductor obtained by the above-described method of the invention has an improved light resistance. The term 'amorphous silicon semiconductor' as used in this specification means any and all amorphous semiconductors containing Si as an essential component and includes a-Si and alloys of a-Si with microcrystalline Si, Sn, Ge and/or other elements. Typical of such amorphous semiconductors are:

a-Si$_{1-x-y}$Ge$_x$C$_y$:H(0≦x,y≦1),

a-Si$_{1-x-y}$Ge$_x$C$_y$:H:F(0≦x,y≦1)

The amorphous semiconductor according to the present invention can be advantageously used in the fabrication of solar cells and other semiconductor devices of the pin construction, a Schottky construction or the like. In the case of a pin type solar cell, it is known that the use of a-Si$_{1-x}$C$_x$ for the p-layer on the light incident side results in higher efficiency and voltage (U.S. Pat. No. 4,388,482).

The following examples are intended to illustrate the present invention in further detail and should by no means be construed as limiting the scope of the invention.

EXAMPLES 1 through 4

Under the conditions set forth in Table 1, pure monosilane gas (SiH₄) was subjected to glow discharge decomposition to give an intrinsic amorphous silicon film on a Corning glass 7059 substrate. The films were designated as Examples 1 through 4, respectively.

Each of the semiconductor films according to Examples 1 through 4 was left standing in a vacuum of about $10^{-3}$ Torr at 160° C. in a cryostat and irradiated with xenon pulsed light at 20-minute intervals. The intensity of pulsed light was about 1 KW/cm² and the pulse width was 1 msec (the irradiation time of each pulse=1/1000 seconds). FIG. 1 shows the normalized value found by dividing the dark conductivity value at 2 seconds after each pulse irradiation by the value immediately before application of the light pulse series. In the diagram, the abscissa represents the number of pulse irradiations, while the ordinate represents the normalized dark conductivity value and the temperatures represent the substrate temperatures. It can been seen that with the repetition of pulse irradiation, the normalized dark conductivity approaches to a constant value close to 1, indicating that the film was progressively stabilized. In other words, the light resistance of the film was as much improved.

TABLE 1

| | Flow rate (sccm) | rf Power (W) | Pressure (Torr) | Substrate temperature (°C.) |
|---|---|---|---|---|
| Example 1 | 5 | 10 | 0.5 | 100 |
| Example 2 | 5 | 10 | 0.5 | 150 |
| Example 3 | 5 | 10 | 0.5 | 200 |
| Example 4 | 5 | 10 | 0.5 | 350 |

EXAMPLE 5

A semiconductor film was prepared under the same conditions as in Example 1 except that a substrate temperature of 250° C. was used. This semiconductor film was irradiated with the same pulsed light as used in Example 1 at 5-minute intervals in a vacuum of about $10^{-3}$ Torr at an ambient temperature of 250° C. for 90 minutes. Thereafter, the change in conductivity was monitored with the film being exposed to light (a pseudo-sunlight of AM-1 100 mW/cm²). The result is shown by a solid line in FIG. 2. In the diagram, the abscissa stands for time and the ordinate for conductivity.

COMPARATIVE EXAMPLE 1

A semiconductor film prepared under the same conditions as in Example 1 was not subjected to the pulsed light treatment of Example 5 but used as it was. This film is designated as Comparative Example 1. The change in conductivity of this semiconductor film was monitored while the film was exposed to light in the same manner as Example 5.

Figure 2:
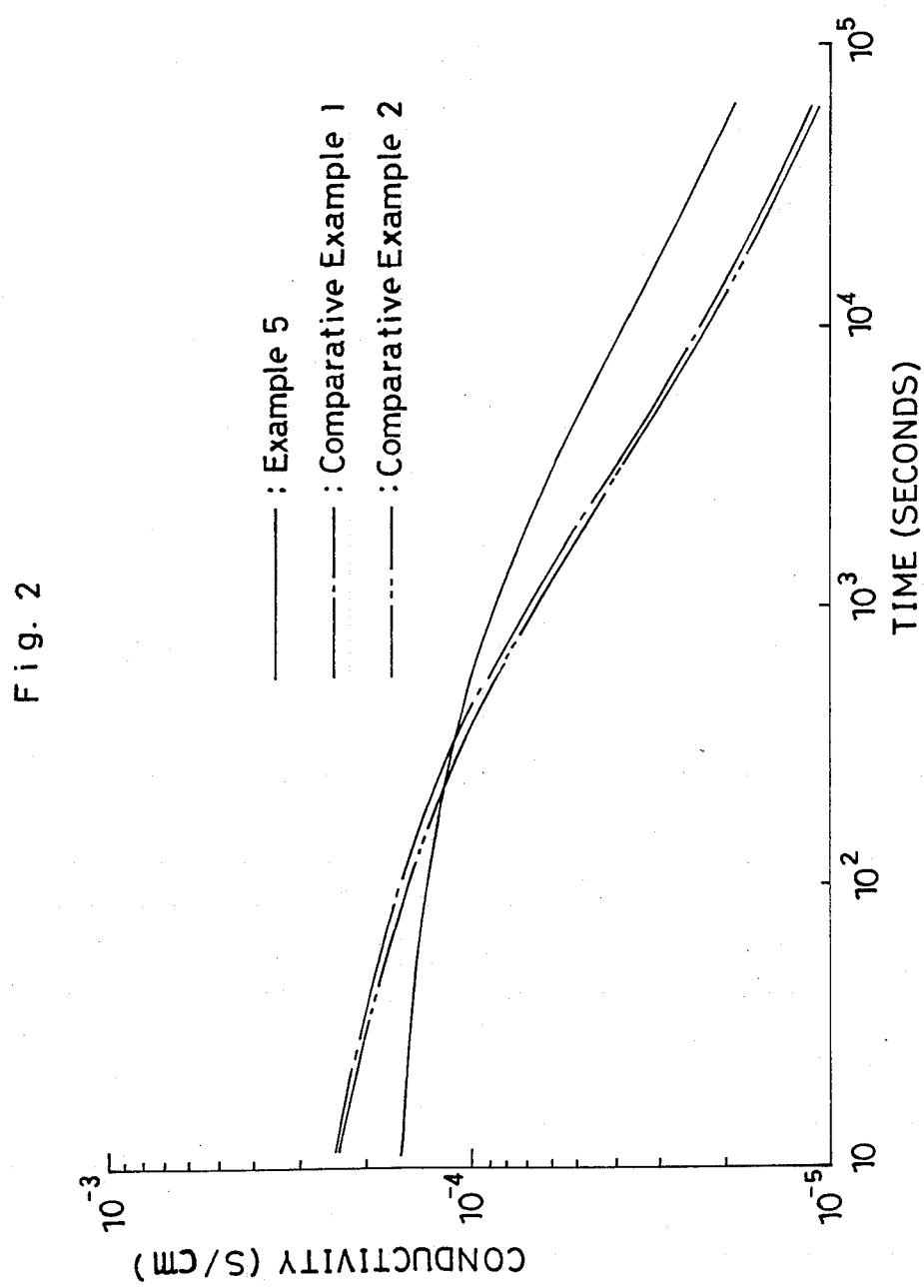
FIG. 2 is a time-conductivity diagram showing the changes in light resistance of an amorphous semiconductor subjected to the irradiation treatment according to the invention and an untreated control semiconductor.

The results is shown by a dot-chain line in FIG. 2.

COMPARATIVE EXAMPLE 2

A semiconductor film prepared under the same conditions as in Example 5 was merely heat-treated at 250° C. for 90 minutes to provide a Comparative Example 2.

The change in conductivity of this film was monitored under exposure to light under the same conditions as in Example 5.

The result is shown by a two dots-chain line in FIG. 2.

It is apparent from FIG. 2 that while Example 5 was lower in initial conductivity than Comparative Example 1, this relationship was reversed within 1,000 seconds and ultimately the light resistance of Example 5 was improved over Comparative Example 1.

Regarding Comparative Example 2, although there was no decrease in initial conductivity, the light resistance was not improved by mere annealing.

EXAMPLE 6

This example pertains to the case in which the photodegradation of an amorphous silicon solar cell is improved by pulsed light treatment. The solar cell used was a two-stacked tandem cell of glass/$SnO_2$/pin/pin/Ag structure.

The amorphous silicon tandem solar cell is described, for example, in Europpean laid-open Patent Application No. 177864. In this solar cell, a carbon-containing amorphous silicon carbide is used for the p-layer. Moreover, this solar cell is provided with a dopant diffusion blocking layer for improving the photodegradation of the cell and this technique is disclosed also in A NEW STABLE a-SiC/a-SiH HETEROJUNCTION SOLAR CELLS included in Proceedings of the 18th IEEE Photovoltaic Specialist Conference, Las Vegas, Nevada, Oct. 21–25, 1985. The solar cell according to this example fundamentally employed the tandem configuration shown in these literature but was not provided with a dopant diffusion blocking layer. Of course, the blocking layer may be provided in the solar cell of this example as well.

Figure 3:
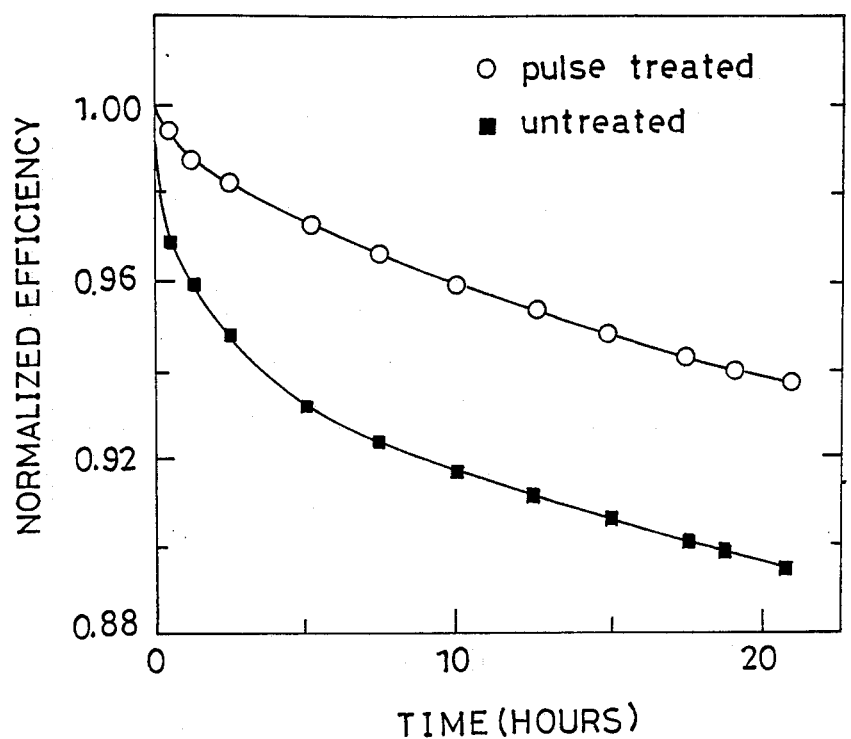
FIG. 3 is a time-photoelectric energy conversion efficiency diagram showing the changes in photoelectric energy conversion efficiency of a solar cell fabricated by using an amorphous semiconductor subjected to the irradiation treatment according to the invention and a control solar cell fabricated by using an untreated control semiconductor.

The pulsed light treatment was carried out in the same manner as in Examples 1 through 4 before application of a silver electrode Ag to the glass/$SnO_2$/pin/pin laminate. FIG. 3 shows the result of an accelerated aging test in which the sample was exposed to a pseudo-sunlight of AM-1 100 mW/$cm^2$ at 30° C. in open circuit. In the diagram, the normalized photoelectric energy conversion efficiency of this solar cell is shown (with the efficiency prior to AM-1 irradiation being taken as 1.00). It is apparent from the diagram that the pulsed light treatment resulted in an improvement of about 40 percent in the degree of photodegradation.

The pulsed light treatment may be carried out on the three-layer pin assembly in the course of fabrication or after completion of the glass/$SnO_2$/pin/pin/Ag laminate. In the latter case, it is of course so arranged that the pulse light will be incident on the glass substrate side. When light pulse irradiation is carried out at a high temperature after vapor deposition of the metal electrode, the heat treatment may result in an adverse effect (degradation) depending on the kinds of metals. In such cases, a thermal degradation barrier layer of, for example, a silicide is preferably interposed between the metal layer and the semiconductor layer. Moreover, generally the stabilization effect is greater when the pulsed light is incident on the n-layer side.

We claim:

1. A method of stabilizing an amorphous silicon semiconductor comprising exposing it intermittently to light of high intensity at a temperature not lower than 150° C.

2. The method of stabilizing an amorphous silicon semiconductor as claimed in claim 1, in which the stabilization is carried out while the amorphous silicon semiconductor comprises a thin-film amorphous semiconductor device.

3. The method of stabilizing an amorphous silicon semiconductor as claimed in claim 2, in which the thin-film amorphous semiconductor device comprises a three-layer pin assembly and the stabilization is carried out during or after completion of fabrication of the three-layer pin assembly.

4. The method of stabilizing an amorphous silicon semiconductor as claimed in claim 3, in which the exposure light is a pulsed light.

5. The method of stabilizing an amorphous silicon semiconductor as claimed in claim 4, in which the pulsed light has an intensity of not less than 10 W/$cm^2$.

6. The method of stabilizing an amorphous silicon semiconductor as claimed in claim 2, in which the exposure light is a pulsed light.

7. The method of stabilizing an amorphous silicon semiconductor as claimed in claim 6, in which the pulsed light has an intensity of not less than 10 W/$cm^2$.

* * * * *